United States Patent [19]

Kamins et al.

[11] 4,087,571
[45] May 2, 1978

[54] CONTROLLED TEMPERATURE POLYCRYSTALLINE SILICON NUCLEATION

[75] Inventors: Theodore I. Kamins, Mountain View; Juliana Manoliu, Palo Alto, both of Calif.

[73] Assignee: Fairchild Camera and Instrument Corporation, Mountain View, Calif.

[21] Appl. No.: 589,821

[22] Filed: Jun. 24, 1975

Related U.S. Application Data

[63] Continuation of Ser. No. 147,912, May 28, 1971, abandoned.

[51] Int. Cl.² .......................................... H01L 21/205
[52] U.S. Cl. ...................................... 427/86; 148/1.5; 148/174

[58] Field of Search .................. 427/86, 82; 148/174, 148/175

[56] References Cited

U.S. PATENT DOCUMENTS

| 3,484,311 | 12/1969 | Benzing | 148/174 |
| 3,508,962 | 4/1970 | Manasevit et al. | 156/613 |
| 3,734,770 | 5/1973 | Price et al. | 427/86 |

Primary Examiner—John T. Goolkasian
Attorney, Agent, or Firm—Alan H. MacPherson; Henry K. Woodward; Robert C. Colwell

[57] ABSTRACT

The diffusivity of an impurity in a layer of polycrystalline silicon is controlled by forming the polycrystalline silicon on a thin nucleating layer of polycrystalline silicon possessing a maximum {110} texture.

3 Claims, 3 Drawing Figures

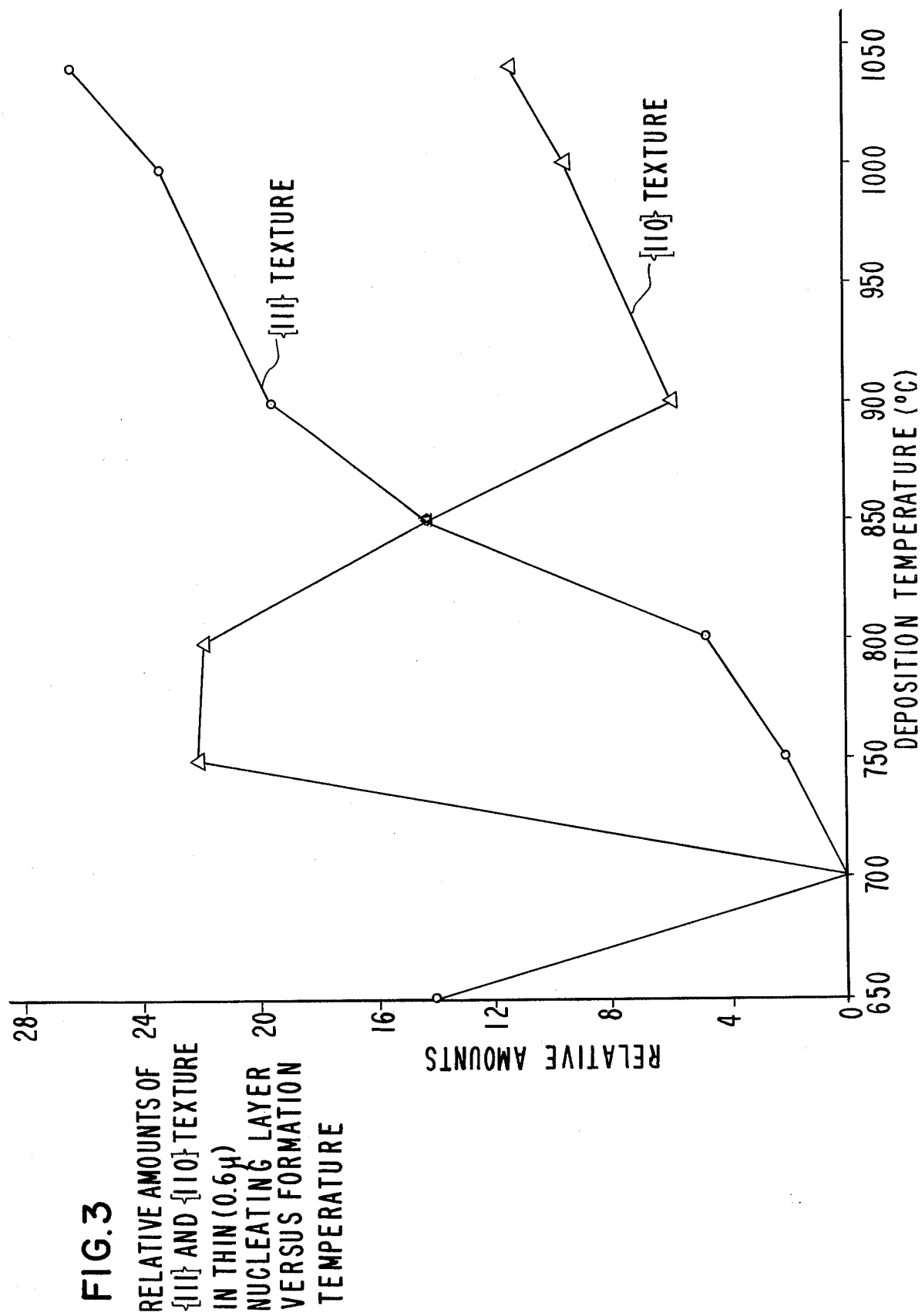

CONTROLLED TEMPERATURE POLYCRYSTALLINE SILICON NUCLEATION

This is a continuation, of application Ser. No. 147,912 filed May 28, 1971, now abandoned.

BACKGROUND OF THE INVENTION

1. Field of the Invention

This invention relates to polycrystalline silicon and in particular to a method by which the diffusivity of impurities in polycrystalline silicon is controlled, and to the resulting structure.

2. Background of the Invention

Polycrystalline silicon is used in monolithic integrated circuits in a variety of ways. Doped polycrystalline silicon is used for contacts to regions formed in the underlying monocrystalline semiconductor material, for conductive interconnection paths on the surface of an integrated circuit and for isolation between active elements of the integrated circuit. One feature of polycrystalline silicon which makes it particularly useful for these applications is that impurities diffuse into it more rapidly than into single-crystal silicon. Recent work shows however that the diffusivity is a strong function of the conditions under which the polycrystalline silicon material is deposited. Tucker and Barry, in patent application Ser. No. 845,822 filed July 29, 1969, now U.S. Pat. No. 3,736,193, disclose a process for electrical isolation in integrated circuits wherein regions of polycrystalline silicon are formed on a doped oxide grid overlying a semiconductor substrate while regions of single-crystal silicon are formed directly on the exposed surface of the semiconductor substrate. Thus it is well-known that polycrystalline silicon can be formed over an oxide layer. Tucker and Barry also disclose that the diffusivity of impurities in polycrystalline silicon is substantially higher than is the diffusivity of the same type of impurities in single-crystal silicon when the polycrystalline silicon is deposited in a narrow range of temperatures centered around 1040° C.

SUMMARY OF THE INVENTION

This invention provides a polycrystalline silicon structure in which the diffusivity of impurities is maximized.

According to this invention, the polycrystalline silicon is deposited upon a nucleating layer of polycrystalline silicon in which the {110} texture is maximized. The nucleating layer is typically less than 1 micron thick and in one embodiment is formed on $SiO_2$ by the decomposition of silane in the temperature range between 750° C and 800° C. Nucleating layers formed between about 710° C and 870° C were discovered to cause the diffusivity of impurities in overlying polycrystalline silicon layers to be substantially greater than the diffusivity of impurities in a polycrystalline layer formed, for example, on silicon dioxide without a nucleating layer. If desired, the nucleating layer can be formed directly on a single crystal silicon substrate omitting the $SiO_2$ layer.

DESCRIPTION OF THE DRAWING

FIG. 3 shows the relative amounts of {111} and {110} texture in a thin (0.6μ) nucleating layer versus the formation temperature of the nucleating layer.

DETAILED DESCRIPTION

This invention is based upon the discovery that the diffusivity of impurities in polycrystalline silicon is maximized when the polycrystalline silicon is formed on a polycrystalline silicon nucleating layer with maximum {110} texture. By {110} texture is meant that the crystal structure of the polycrystalline silicon nucleating layer contains a maximum number of crystals with the {110} orientation.

Numerous different crystal textures are present in polycrystalline silicon. Two of these textures, the {111} and the {110}, can be measured much easier than can the other textures. While it is possible to roughly compare the proportionate concentrations of crystals of the {111} texture to crystals of the {110} texture, it is extremely difficult to obtain a measure of the percentage of the total crystal structure constituted by either the {111} or the {110} textured crystals.

FIG. 3, however, shows relative concentrations of the {111} and {110} textured crystals as a function of the deposition temperature of the polycrystalline silicon. This figure shows that between a deposition temperature of 700° C to 850° C {110} textured crystals are more numerous than {111} textured crystals.

Polycrystalline silicon is commonly formed on semiconductor wafers by first putting down a dielectric layer and then forming the polycrystalline silicon on the dielectric layer. Typically, the dielectric is $SiO_2$, silicon dioxide.

Figure 1:
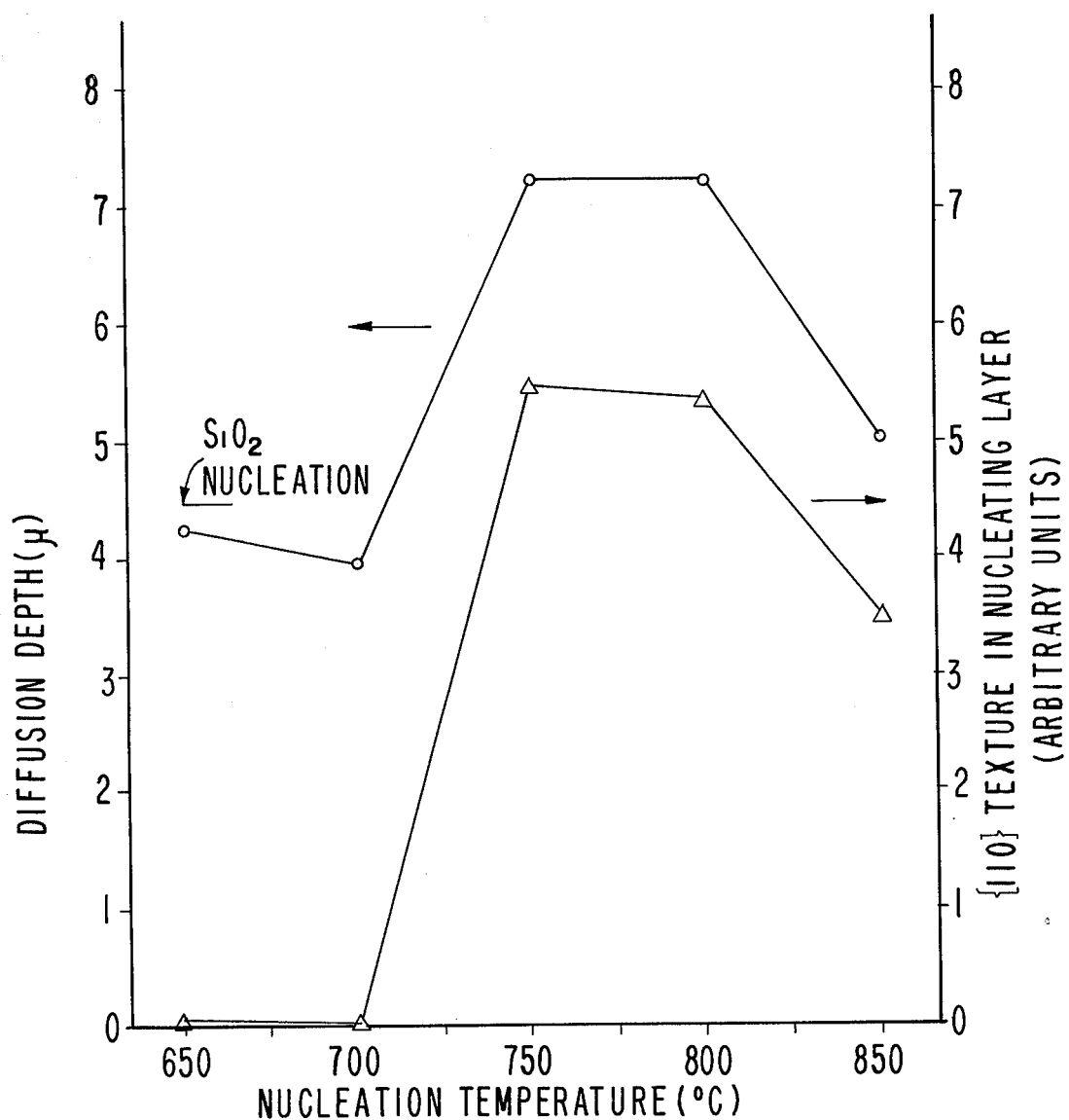
FIG. 1 is a graph showing the diffusion depth of an impurity after a two hour diffusion at 1,000° C from a phosphorus doped oxide in a dry nitrogen ambient into a 15-micron-thick, polycrystalline silicon layer formed on a 0.6-micron-thick nucleating layer of polycrystalline silicon as a function of the deposition temperature of the nucleating layer.

FIG. 1 compares the diffusion depth of an impurity into a 15 micron thick polycrystalline silicon layer formed on a silicon dioxide layer, to the diffusion depth of the same impurity into polycrystalline silicon formed on thin nucleating layers of polycrystalline silicon about 0.6 microns thick containing various amounts of {110} texture. The nucleating layers used to obtain the data shown in FIG. 1 were formed on $SiO_2$ at 650° C, 700° C, 750° C, 800° C and 850° C. This figure shows that forming the thick polycrystalline silicon on thin nucleating layers of polycrystalline silicon which in turn were formed at a temperature in the range of 750° C to 800° C allows the impurities to diffuse to a maximum depth in the thicker polycrystalline silicon. This diffusion depth is considerably greater than the diffusion depth obtained in a polycrystalline silicon layer formed upon a silicon dioxide nucleating layer. FIG. 1 shows that a typical diffusion depth in polycrystalline silicon formed on silicon dioxide is 4.5 microns as opposed to a diffusion depth under the same conditions of about 7.5 microns for the polycrystalline silicon formed on a thin nucleating layer of polycrystalline silicon which in turn is formed at a temperature from 750° C to 800° C. It should be noted that the term "thin" as used in this specification to describe the nucleating layer means a layer of material 1 micron or less in thickness. The one micron limitation on the maximum thickness for the nucleating layer is not an absolute limit but rather is determined by the masking tolerances acceptable in forming the nucleating layer into the desired pattern. The greater the accuracy required in forming the nucleating layer into the desired pattern, the thinner the nucleating layer must be. A minimum thickness is determined by the requirement for the development of significant {110} texture in the nucleating layer. Using presently available processing techniques, this minimum thickness is about 0.3 microns.

To demonstrate the invention, nucleating layers of polycrystalline silicon were formed from the decomposition of silane in a hydrogen atmosphere at each of several temperatures: 650° C, 700° C, 750° C, 800° C, and 850° C. Then thick layers of polycrystalline silicon were deposited in the same manner at 1,035° C simultaneously on nucleating layers formed at each temperature. An impurity was then diffused into the thick layers of polycrystalline silicon. The study showed that the diffusivity of the impurity into the thick layers of polycrystalline silicon was a maximum in those polycrystalline layers deposited on nucleating layers of polycrystalline silicon formed between the temperatures of 750° C and 800° C. This fact is particularly important when polycrystalline silicon and single crystal silicon must be formed simultaneously on the same wafer. Single crystal silicon can be formed epitaxially on a silicon substrate only at temperatures above about 1,000° C. This lower temperature varies from reactor to reactor but 1,000° C is generally accepted as the lowest temperature at which epitaxial silicon can be formed with conventional reactors now employed in the semiconductor industry. It should be noted, however, that future developments may result in the lowering of this temperature and this invention can then be used with these new processes. The upper temperature limit on the deposition of polycrystalline silicon is controlled by the fact that as a general rule one wants to form the epitaxial layer at as low a temperature as possible to prevent the previously diffused regions in the underlying semiconductor wafer from changing their diffusion profiles or out-diffusing. Thus, 1,050° C is generally accepted as an upper limit for the formation of epitaxial silicon although this upper temperature can likewise change depending upon the processing restrictions imposed for the particular wafer being processed. The upper and lower temperatures specified above apply only when the polycrystalline and single crystal silicon are formed from the decomposition of silane.

Thus, this study showed that when the polycrystalline silicon is formed at between 1,000° C to 1,050° C and particularly at about 1,035° C, the diffusion depth of the impurity into the thick polycrystalline silicon is a maximum when the thin polycrystalline silicon nucleating layer is formed at a temperature between 750° C and 800° C. As shown in FIG. 1, the maximum diffusion depth of an impurity into a polycrystalline silicon layer formed under these conditions is almost double the diffusion depth of an impurity into polycrystalline silicon formed on a silicon dioxide nucleating layer. It should be noted that some gain in diffusion depth is also obtained when this nucleating layer is formed over a broader temperature range between about 710° C and 870° C. (See FIG. 1).

The nucleating layer can be formed by either chemical vapor deposition or by evaporation. Commonly, the nucleating layer is formed from the thermal decomposition of silane. Other techniques suitable for forming a thin layer of polycrystalline silicon with maximum {110} texture on an underlying single-crystal or other type substrate are also appropriate for use with this invention.

For a given deposition rate of approximately 0.1 microns per minute, the maximum {110} texture is found when the polycrystalline silicon nucleating layer is formed between 750° C and 800° C over silicon dioxide. A rate of 0.1 microns per minute is convenient since the nucleating layer must be thick enough for the texture to have developed but thin enough to define easily by photomasking. Thus, the nucleating layer should be roughly between 0.3 and 1.0 microns thick and the deposition time would then be from three to ten minutes at a rate of 0.1 microns per minute. The optimum deposition temperature for the nucleating layer may shift slightly for different deposition rates.

A thicker layer of polycrystalline silicon is then formed on the nucleating layer, typically from the decomposition of silane, to the desired thickness.

Figure 2:
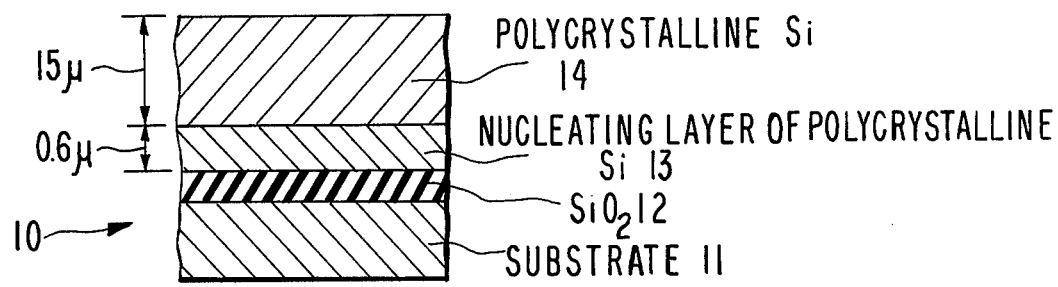
FIG. 2 shows in cross-section one structure of the invention.

In one embodiment a 15-micron-thick, polycrystalline silicon layer 14 (FIG. 2) was formed on a 0.6-micron-thick nucleating layer 13 of polycrystalline silicon formed at 800° C. Layer 14 was formed at a temperature of 1,035° C by the decomposition of silane. The deposition rate was about 0.5 microns per minute. The nucleating layer itself was formed on a silicone dioxide layer 12 which in turn was formed on a single-crystal silicon substrate 11. The diffusion depth of an impurity was as shown in FIG. 1.

Although the amount of {110} texture in the nucleating films can be correlated with the diffusivity of impurities in the overlying polycrystalline silicon layer, the mechanism of the diffusion and the role of the film texture are not fully understood. However, the bulk of the evidence indicates that the enhanced diffusivity can be attributed to diffusion down some type of defect in the polycrystalline material. It is believed that the {110} texture in the nucleating layer insures that a large number of platelets are formed in the overlying thick polycrystalline silicon layer. The impurity then diffuses more readily along the boundaries between platelets than it does through the platelets themselves thereby enhancing the diffusion of the impurity into the thick polycrystalline layer. The diffusion of impurities thus proceeds by a two-step process. The impurities first diffuse down the defects into the film; then they diffuse laterally out of the defect regions into the adjacent crystallites. Some of these crystallites are platelets and some are other crystal structures.

There is good correlation between the enhanced diffusion of impurities in the polycrystalline silicon films and the surface topography of the films. The occurrence of pointed rosette structures which resemble multifaceted cones on the surface of the film is characteristic of material into which impurities diffuse rapidly. At higher deposition temperatures (e.g. 1,100° C) only isolated regions of this nature occur. As the temperature is lowered to the region of 1,000° C the isolated rosettes become numerous and cover the entire surface of the material. Electron diffraction indicates that these structures are highly defective {110} regions. In cross-section these regions appear as nearly vertical arrays of very long, very fine columnar or platelet crystallites. The individual crystallites are apparently many microns in length but only a small fraction of a micron in width. The vertical ordering of the structure becomes more pronounced with increased film thickness. Consequently the diffusivity increases with increasing film thickness.

As the fast diffusing {110} regions become more prevalent, not only does the average impurity diffusivity increase, but the diffusion front becomes more uniform. Since the boundaries or imperfections down which the impurities are postulated to diffuse are very closely spaced, little time is required for the impurities to diffuse out of these boundaries and dope the adjacent crystallites.

The decrease in diffusivity at still lower deposition temperatures is most likely related to the abrupt change in the structure which occurs when the deposition temperature is lowered. Polycrystalline films deposited at temperatures below about 1,000° C lose the columnar or platelet arrays characteristic of the polycrystalline layer which shows maximum diffusion enhancement. Instead these polycrystalline films are made up of small, randomly arranged grains. Thus, there is less probability of finding long, well-defined channels for easy diffusion; consequently, the average depth of impurity diffusion decreases. It is noted that the diffusivity is anisotropic in the optimum material. This means that the impurities diffuse a greater distance vertically than they do laterally. This is consistent with the assumption of diffusion down long defects separating the columnar or platelet regions.

What is claimed is:

1. The method of forming a polycrystalline silicon layer upon a substrate which comprises:

forming a nucleating layer of polycrystalline silicon on said substrate at a temperature in the range of about 750° C to 800° C such that said nucleating layer possesses a substantially maximum [110] texture; and forming a second polycrystalline silicon layer on said nucleating layer at a second, higher temperature suitable for the simultaneous formation of polycrystalline silicon on said nucleating layer and, epitaxially, single crystal silicon upon said substrate.

2. The method of claim 1 wherein said temperature at which said second polycrystalline layer is formed is above 1000° C.

3. The method of claim 1 wherein said nucleating layer is formed to a thickness of about 0.3 to 1.0 microns.

* * * * *